United States Patent
Bennett et al.

(10) Patent No.: US 7,129,763 B1
(45) Date of Patent: Oct. 31, 2006

(54) ADJUSTING POWER CONSUMPTION OF DIGITAL CIRCUITRY BY GENERATING FREQUENCY ERROR REPRESENTING ERROR IN PROPAGATION DELAY

(75) Inventors: George J. Bennett, Murrieta, CA (US); Steven R. Vasquez, Rancho Santa Margarita, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 10/983,382

(22) Filed: Nov. 8, 2004

(51) Int. Cl.
*H03L 7/06* (2006.01)
*H03L 7/00* (2006.01)

(52) U.S. Cl. .............. 327/262; 327/270; 327/295; 331/1 A

(58) Field of Classification Search ........ 327/147–149, 327/156–158, 153, 161, 236, 295, 291, 270, 327/262; 331/1 A, 47
See application file for complete search history.

(56) References Cited

U.S. PATENT DOCUMENTS

| | | | |
|---|---|---|---|
| 4,675,617 A * | 6/1987 | Martin | 331/1 A |
| 4,737,670 A | 4/1988 | Chan | |
| 4,822,144 A * | 4/1989 | Vriens | 349/71 |
| 4,922,141 A * | 5/1990 | Lofgren et al. | 327/158 |
| 5,146,121 A * | 9/1992 | Searles et al. | 327/276 |
| 5,440,250 A | 8/1995 | Albert | |
| 5,440,520 A | 8/1995 | Schutz et al. | |
| 5,638,019 A * | 6/1997 | Frankeny | 327/295 |
| 5,777,567 A * | 7/1998 | Murata et al. | 341/100 |
| 6,055,287 A * | 4/2000 | McEwan | 375/376 |
| 6,125,157 A | 9/2000 | Donnelly et al. | |
| 6,157,247 A | 12/2000 | Abdesselem et al. | |
| 6,259,293 B1 * | 7/2001 | Hayase et al. | 327/276 |
| 6,333,652 B1 * | 12/2001 | Iida et al. | 327/161 |
| 6,356,062 B1 | 3/2002 | Elmhurst et al. | |
| 6,424,184 B1 | 7/2002 | Yamamoto et al. | |
| 6,425,086 B1 | 7/2002 | Clark et al. | |
| 6,449,575 B1 | 9/2002 | Bausch et al. | |
| 6,525,585 B1 * | 2/2003 | Iida et al. | 327/279 |
| 6,535,735 B1 | 3/2003 | Underbrink et al. | |
| 6,577,535 B1 | 6/2003 | Pasternak | |
| 6,617,936 B1 * | 9/2003 | Dally et al. | 331/57 |
| 6,693,473 B1 | 2/2004 | Alexander et al. | |
| 6,868,503 B1 | 3/2005 | Maksimovic et al. | |
| 6,870,410 B1 | 3/2005 | Doyle et al. | |
| 2003/0093160 A1 | 5/2003 | Maksimovic et al. | |
| 2005/0218871 A1 | 10/2005 | Kang et al. | |

OTHER PUBLICATIONS

T. D. Burd, T. A. Pering, R. W. Brodersen, "A Dynamic Voltage Scaled Microprocessor System" IEEE Journal of Solid State Circuits, vol. 35, No. 11, Nov. 2000.

G. Y. Wei, M. Horowitz, "A Fully Digital, Energy-Efficient, Adaptive Power-Supply Regulator" IEEE Journal of Solid State Circuits, vol. 34, No. 4, Apr. 1999.

* cited by examiner

*Primary Examiner*—Dinh T. Le
(74) *Attorney, Agent, or Firm*—Howard H. Sheerin, Esq.

(57) ABSTRACT

A method and apparatus is disclosed for adjusting at least one of a supply voltage and a clocking frequency applied to digital circuitry of a computing device, wherein the digital circuitry comprises a critical path circuit. A propagation delay frequency representing a propagation delay of the critical path circuit is generated, and a frequency error signal is generated representing a difference between a reference frequency and the propagation delay frequency. At least one of the supply voltage and the clocking frequency is adjusted in response to the frequency error signal.

27 Claims, 12 Drawing Sheets

ADJUSTING POWER CONSUMPTION OF DIGITAL CIRCUITRY BY GENERATING FREQUENCY ERROR REPRESENTING ERROR IN PROPAGATION DELAY

BACKGROUND OF THE INVENTION

1. Field of the Invention

The present invention relates to digital circuitry for computing devices. In particular, the present invention relates to adjusting power consumption of digital circuitry by generating a frequency error representing error in propagation delay.

2. Description of the Prior Art

Reducing power consumption of digital circuitry in computing devices increases battery life in portable applications (such as cellular telephones, portable computers, digital cameras, and the like) in addition to increasing the overall reliability/longevity since reducing power consumption reduces the operating temperature and associated stress on the device. In some computing devices, the propagation delays through certain critical paths of the digital circuitry that must remain within prescribed thresholds for proper operation affect the power consumption of the device. For example, manufactures have imposed certain restrictions on process tolerances and supply voltages to ensure the propagation delays remain within an acceptable operating range under worst case operating conditions, such as worst-case process deviation and highest ambient temperature. However, operating all of the computing devices at a predetermined supply voltage to account for worst case conditions leads to inefficient power consumption for the majority of the devices that could operate with acceptable performance using a lower supply voltage.

An alternative approach to achieving acceptable propagation delays is to limit the clocking frequency of the digital circuitry to ensure reliable performance under all operating conditions, such as process deviations and ambient temperature. Reducing the clocking frequency also reduces power consumption, which is directly related to the switching frequency of the digital circuitry. However, for applications where limiting the clocking frequency leads to unacceptably slow performance, acceptable propagation delay is achieved by increasing the supply voltage.

Prior art techniques have been suggested for measuring the propagation delay through a critical path of the digital circuitry in order to adapt the supply voltage and/or the clocking frequency in order to optimize the power consumption and/or operating speed of each individual device. FIG. 1 shows an overview of a typical prior art implementation for measuring the propagation delay of a critical path circuit 2 and adjusting the supply voltage and/or clock frequency 4 (see, for example, U.S. Pat. Nos. 6,157,247 and 6,535,735). Matched delay circuit 6 is included in the device, which matches the operating characteristics of the critical path circuit 2. A periodic input signal 8 is applied to the matched delay circuit 6, wherein the output 10 of the matched delay circuit 6 is the periodic input signal 8 shifted by a phase proportional to the propagation delay of the critical path circuit 2. A phase comparator 12 measures the phase difference between the periodic input signal 8 and the output 10 of the matched delay circuit 6, wherein the phase difference generates a pulse width modulated (PWM) signal 14 having a duty cycle proportional to the propagation delay of the matched delay circuit 6. The PWM signal 14 is converted by conversion circuitry 16 into an analog signal 18 which is filtered by filter 20. The output of filter 20 is a DC control signal 22 applied to an adjustable supply voltage/clock circuit 24 which outputs the adjusted supply voltage and/or clock frequency 4 applied to both the critical path circuit 2 and the matched delay circuit 2. In this manner, the supply voltage and/or clock frequency 4 is adjusted to maintain a target propagation delay through the critical path circuit 2 thereby adapting the power consumption and/or operating speed of the device.

There are a number of drawbacks with the prior art phase comparison technique for measuring the error in propagation delay in order to adjust the supply voltage and/or clocking frequency of digital circuits. In the above mentioned '247 patent, the target propagation delay is set equal to the period of the input signal 8 so that the supply voltage is adjusted until the output of the phase comparator is zero (i.e., the supply voltage is adjusted until the output 10 of the matched delay circuit 6 is delayed by one period of the input signal 8). This technique requires the input signal 8 be generated with a period equal to the target propagation delay resulting in design limitations, for example, if the critical path changes relative to the mode of operation or if there are two critical paths with different propagation delays operating simultaneously. Additional margin (in the form of higher supply voltage or lower clocking frequency) is also required to compensate for tolerances in converting 16 the PWM signal 14 into the analog signal 18. That is, a zero phase error in the PWM signal 14 will not convert 16 exactly to a zero analog signal 18, and vise versa, leading to an offset in the propagation delay error. For example, since the DC control signal 22 is proportional to the input frequency 8, as well as proportional to the voltage supplying the conversion circuitry 16, and since the PWM signal frequency is comparable to the delays through the digital circuit, the proportionality of voltage to frequency is not precise. Output rise and fall time errors, impedance, differential delays of the circuitry between rise and fall times, and so forth, all contribute errors in the proportionality constant, and add voltage conversion offsets. As the target propagation delay through the critical path circuit 2 decreases for higher performance circuits, the delay gets closer to the operating speeds of the digital gates and the proportionality and offset problems are magnified. Since the highest performance circuits (which require minimal gate delays) consume the most power, the benefit of optimizing power consumption is even more apparent, yet the conversion errors are at their worst for these circuits because the frequency needed to measure the propagation delay is closest to the gate speed limits.

In the above mentioned '735 patent, the propagation delay error is measured as the difference between the DC control signal 22 and a reference signal (e.g., a reference voltage). However similar to the '247 patent, the conversion circuitry 16 for converting the PWM signal 14 into the analog signal 18 exhibits unavoidable tolerances requiring additional margin. Moreover, the reference signal for comparing against the DC control signal 22 has tolerances, as does the comparison circuitry. Still further, if the clocking frequency of the digital circuitry is adjusted (e.g., to facilitate different operating modes or to optimize power consumption), non-linearities between the frequency of the input signal 8 and the target reference signal leads to additional voltage errors. Since power and speed are proportional to the square of the supply voltage of a digital circuit, these introduced voltage errors multiply the power and speed error significantly.

Yet another drawback with the '735 patent is that the period of the input signal 8 must be appropriately selected relative to the propagation delay of the critical path circuit 2 so that the phase shift at the output 10 of the matched delay circuit 6 has sufficient range while timely updating the output of the phase comparator 12. This problem is exacerbated if a device has a number of critical path circuits that may be enabled at different times, wherein the propagation delay varies significantly between each critical path circuit requiring a corresponding change in the periodic input signal 8. If two such critical paths exist and must operate simultaneously, for example, and the delay through each circuit differs substantially, then either input signals 8 with different frequencies must be provided, or different reference signals to compare against the DC control signal 22 must be used, requiring additional circuitry. Further, the worst critical path must be determined before the circuit is manufactured, so that when both circuits operate the correct circuit is measured for control of the voltage loop requiring additional margin when multiple circuits run simultaneously.

Still further, a control loop implemented with the prior art phase comparison technique exhibits poor transient response requiring additional margin to ensure proper operation of the device under all operating conditions. The voltage control loop is typically tuned for the highest possible gain within stability limits to achieve the best transient response. Lower frequency response is required to allow for the performance differences that will occur due to the above-mentioned proportionality differences (which translate into a gain change in the control loop). This lower frequency response means the loop must be tuned for slower transient response, which in turn requires either larger energy storage elements to limit the voltage droop, or larger margins to allow for a larger supply voltage transient drop. More importantly, the loop response will vary with each part produced.

There is, therefore, a need to improve upon the current techniques for adjusting the supply voltage and/or clocking frequency of critical path circuitry in order to optimize power consumption and/or operating speed of computing devices, such as cellular telephones, portable computers, digital cameras, and the like.

SUMMARY OF THE INVENTION

The present invention may be regarded as a computing device comprising digital circuitry including a critical path circuit, and a propagation delay circuit for generating a propagation delay frequency representing a propagation delay of the critical path circuit. The computing device further comprises a reference frequency and a frequency comparator for generating a frequency error signal representing a difference between the reference frequency and the propagation delay frequency. An adjustable circuit, responsive to the frequency error signal, adjusts at least one of a supply voltage and a clocking frequency applied to the critical path circuit.

In one embodiment, the propagation delay circuit comprises a matched delay oscillator. In one embodiment, the matched delay oscillator comprises a plurality of matched delay circuits connected in series in order to scale the propagation delay frequency, wherein each matched delay circuit substantially matches the critical path circuit.

In another embodiment, the computing device further comprises an integrator for generating an integrated frequency error signal, wherein the adjustable circuit is responsive to the integrated frequency error signal. In one embodiment, the integrator comprises discrete-time circuitry such that the integrated frequency error signal is a discrete-time signal. In another embodiment, the computing device comprises a conversion circuit for converting the integrated frequency error signal into a continuous-time signal, wherein the adjustable circuit is responsive to the continuous-time signal. In one embodiment, a scalar is used to generate a proportional frequency error signal which is added to the integrated frequency error signal to generate a proportional/integral frequency error signal, wherein the adjustable circuit is responsive to the proportional/integral frequency error signal.

In yet another embodiment, the frequency comparator comprises an up/down counter clocked by the reference frequency for a first interval and clocked by the propagation delay frequency for a second interval. In one embodiment, at least one of the first and second intervals is programmable. In another embodiment, the up/down counter outputs a pulse width modulated (PWM) signal having a duty cycle proportional to a difference in frequency between the reference frequency and the propagation delay frequency. In one embodiment, a filter filters the PWM signal.

In another embodiment, the frequency error signal is a digital signal applied serially to a serial input pin of the adjustable circuit.

In still another embodiment, the reference frequency is generated in response to the clocking frequency applied to the critical path circuit.

The present invention may also be regarded as a method of adjusting at least one of a supply voltage and a clocking frequency applied to digital circuitry of a computing device, wherein the digital circuitry comprises a critical path circuit. A propagation delay frequency representing a propagation delay of the critical path circuit is generated, and a frequency error signal is generated representing a difference between a reference frequency and the propagation delay frequency. At least one of the supply voltage and the clocking frequency is adjusted in response to the frequency error signal.

DESCRIPTION OF THE PREFERRED EMBODIMENTS

Figure 2:
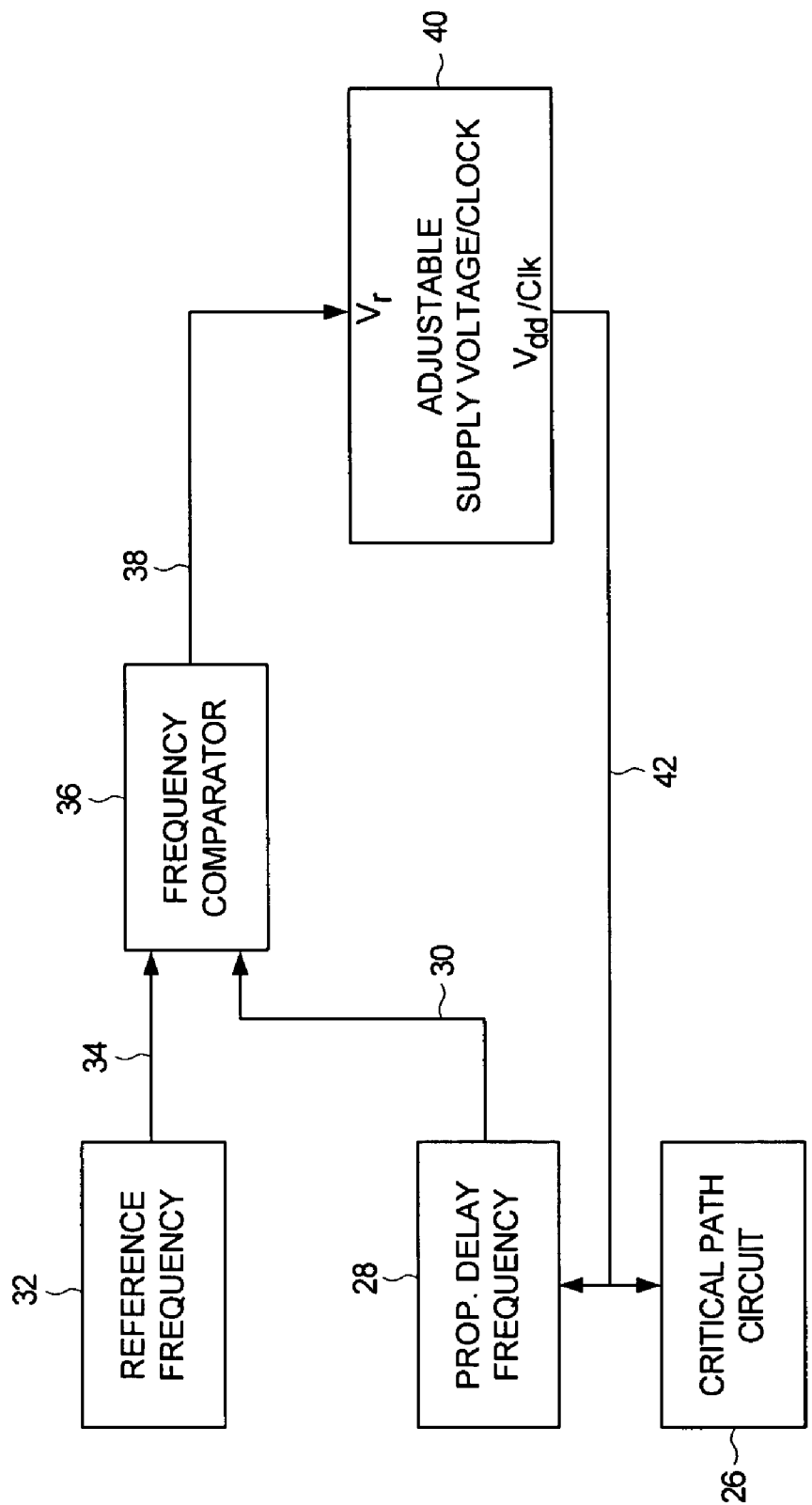
FIG. 2 shows an embodiment of the present invention for adapting at least one of a supply voltage and a clocking frequency in response to a frequency error signal representing a difference in frequency between a reference frequency and a propagation delay frequency.

FIG. 2 shows a computing device according to an embodiment of the present invention comprising digital circuitry including a critical path circuit 26, and a propagation delay circuit 28 for generating a propagation delay frequency 30 representing a propagation delay of the critical path circuit 26. The computing device further comprises a frequency generator 32 for generating a reference frequency 34 and a frequency comparator 36 for generating a frequency error signal 38 representing a difference between the reference frequency 34 and the propagation delay frequency 30. An adjustable circuit 40, responsive to the frequency error signal 38, adjusts at least one of a supply voltage and a clocking frequency 42 applied to the critical path circuit 26.

Figure 1:
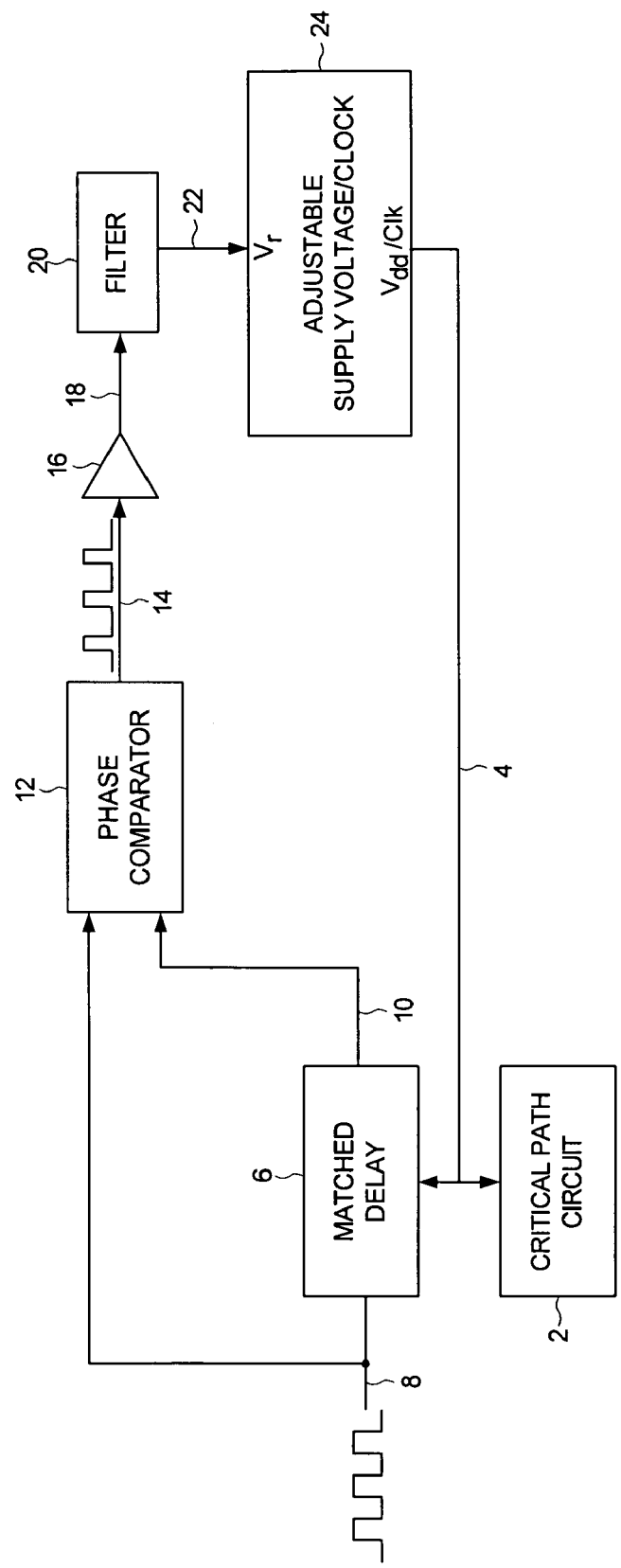
FIG. 1 shows a prior art phase comparison technique for adjusting at least one of a supply voltage and a clocking frequency to adapt the power consumption of a computing device.

Adjusting the supply voltage and/or clocking frequency in response to a frequency error signal representing the error in propagation delay overcomes many of the drawbacks associated with the prior art phase comparison techniques described above with reference to FIG. 1. In particular, the frequency comparator 36 generates the frequency error signal 38 in discrete-time (using, for example, digital circuitry) over multiple periods of the reference frequency thereby reducing the measurement error as compared to the prior art phase comparator 12 of FIG. 1 which generates a continuous-time PWM signal 14 for each period of the reference frequency. The tolerances in rise/fall times of the prior art phase comparator 12 are not present with the frequency comparison technique shown in FIG. 2. In addition, the frequency comparison technique of the present invention provides more flexibility, for example, if the critical path circuit changes relative to the mode of operation or if multiple critical paths are operating simultaneously.

Figure 3A:
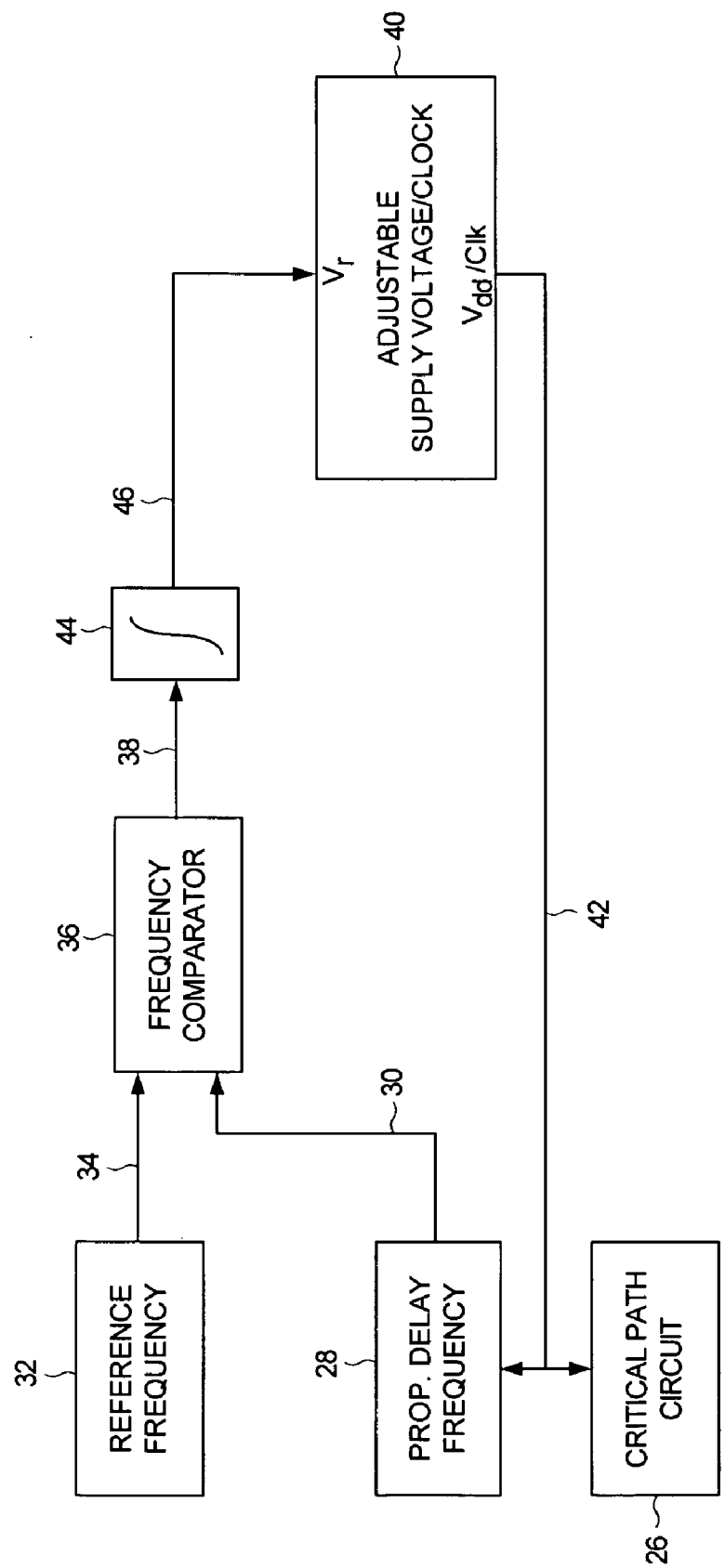
FIG. 3A shows an embodiment of the present invention wherein an integrated frequency error signal is generated for adjusting at least one of the supply voltage and the clocking frequency.

In an embodiment shown in FIG. 3A, the frequency error signal 38 is integrated 44 to generate an integrated frequency error signal 46, wherein the adjustable circuit 40 is responsive to the integrated frequency error signal 46. Adjusting the supply voltage and/or clocking frequency 42 in response to the integrated frequency error signal 46 forms a control loop which drives the frequency error signal 38 toward zero. In one embodiment, the adjustable circuit 40 is configured to output a high supply voltage and/or low clocking frequency 42 when the computing device is initially turned on or when it switches between different critical path circuits corresponding to different operating modes. This allows the integrated frequency error signal 46 to settle to an acceptable value before enabling adaptive power consumption.

Figure 3B:
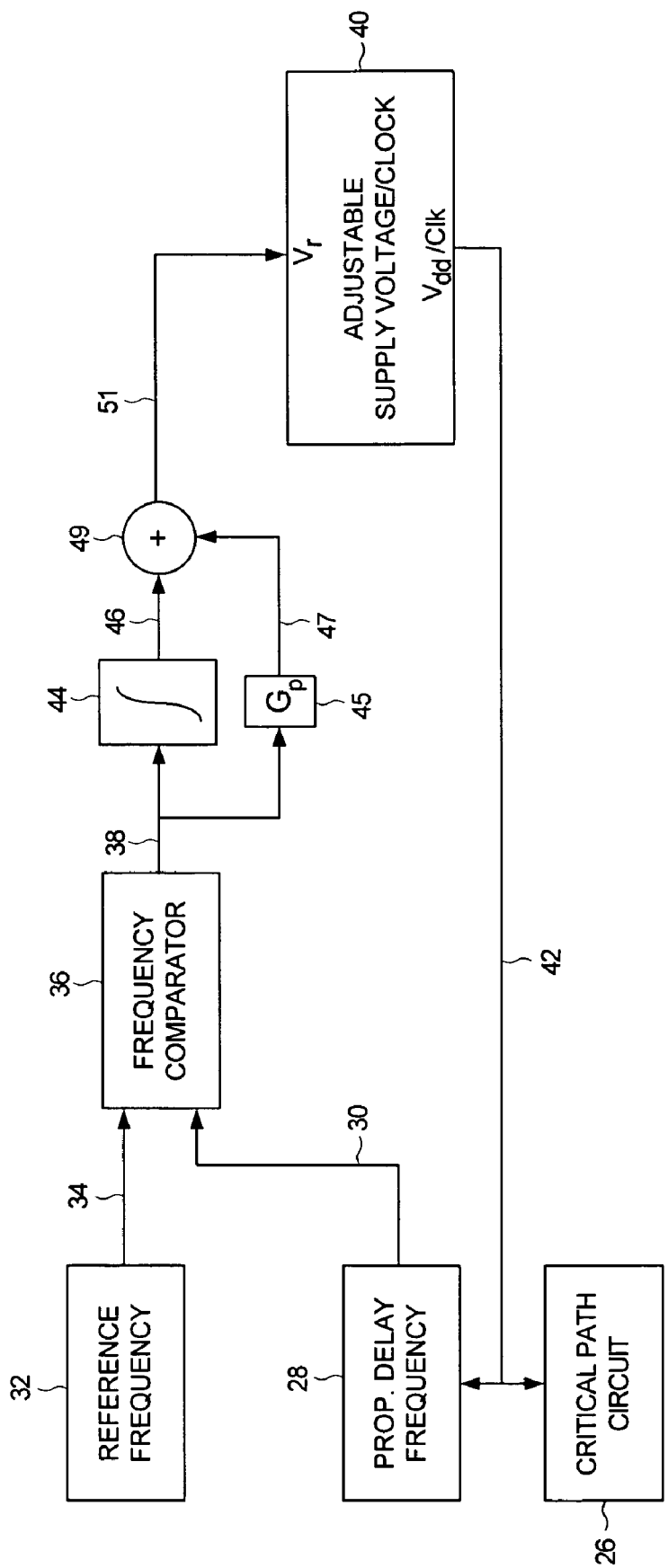
FIG. 3B shows an embodiment of the present invention wherein a proportional/integral frequency error signal is generated for adjusting at least one of the supply voltage and the clocking frequency.

FIG. 3B shows another embodiment of the present invention comprising a scalar 45 for generating a proportional frequency error signal 47 which is added 49 to the integrated frequency error signal 46 to generate a proportional/integral frequency error signal 51 to thereby implement a proportional/integral (PI) control loop. The PI frequency error signal 51 improves the transient response of the control loop as compared to the prior art phase comparison technique shown in FIG. 1.

Figure 4A:
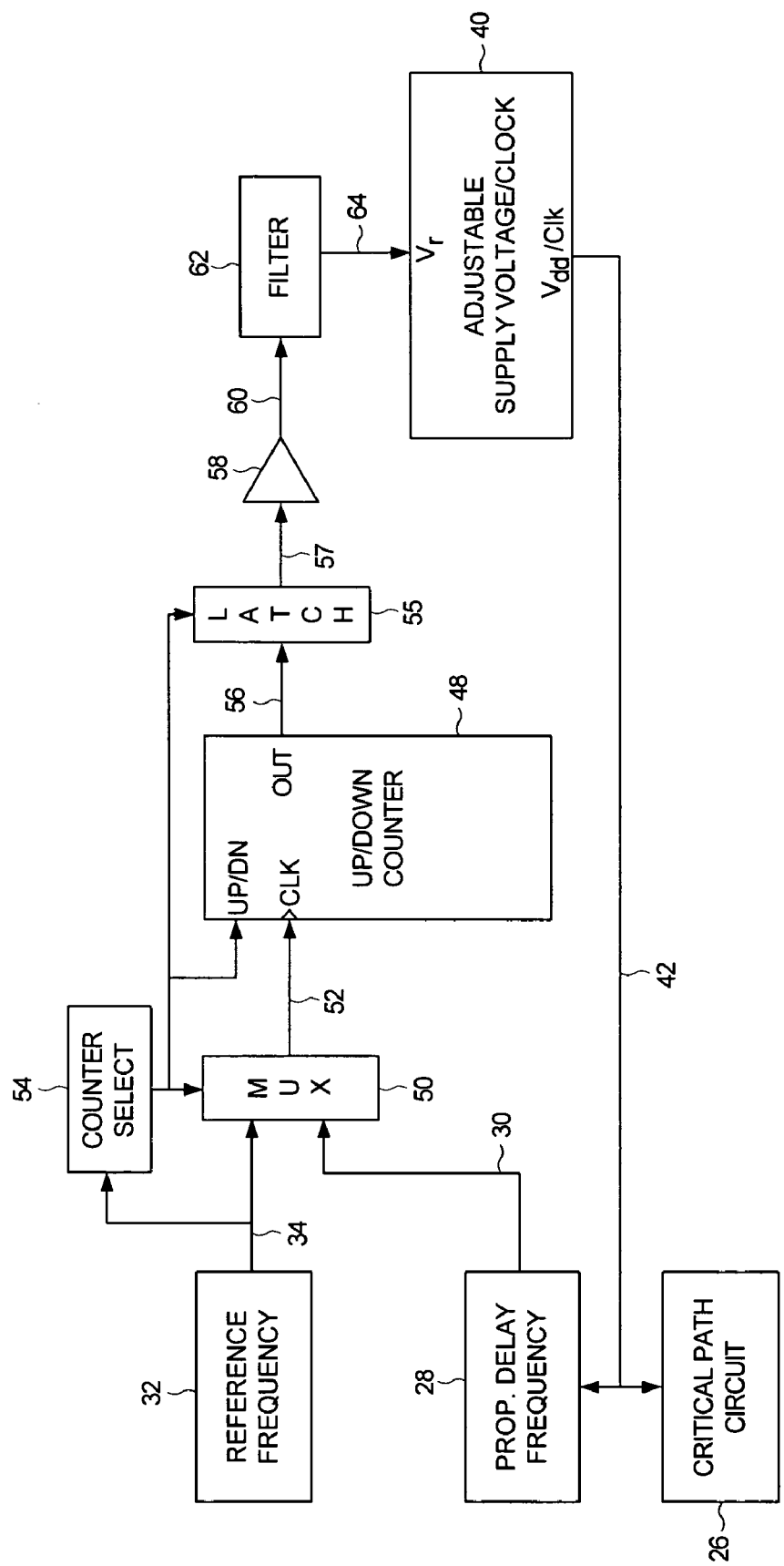
FIG. 4A shows an embodiment of the present invention wherein an up/down counter is used to compute the difference in frequency between the reference frequency and the propagation delay frequency.
Figure 4B:
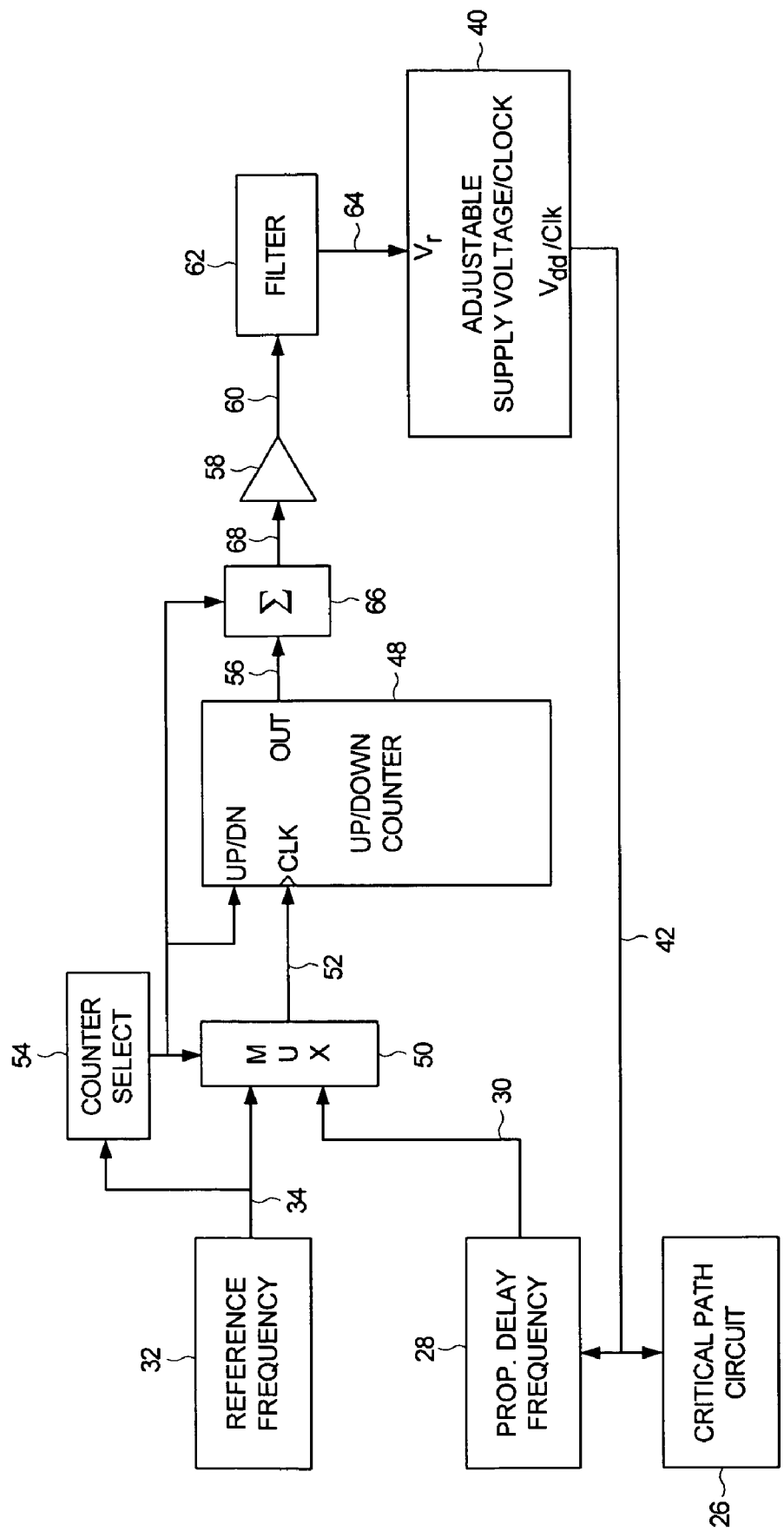
FIG. 4B shows an embodiment of the present invention wherein the integrated frequency error signal is generated by summing an output of the up/down counter.

In embodiments described below with reference to FIGS. 4B–4D, the frequency error signal 38 is integrated in discrete-time and the discrete-time signal 46 converted to a continuous-time signal applied to the adjustable circuit 40. This overcomes the conversion tolerance of the prior art phase comparison technique described above with reference to FIG. 1 since the propagation delay error is driven to zero independent of any conversion errors associated with converting the discrete-time signal to a continuous-time signal applied to the adjustable circuit 40. In other words, any conversion errors that would otherwise be present are integrated out.

The frequency comparator 36 of FIG. 2 may be implemented using any suitable circuitry. FIG. 4A shows an embodiment of the present invention wherein the frequency comparator 36 comprises an up/down counter 48. A multiplexer 50 selects between the propagation delay frequency 30 and the reference frequency 34 as the clock signal 52 to the up/down counter 48. A counter select circuit 54 configures the multiplexer 50 to select the reference frequency 34 as the clock signal 52 and configures the up/down counter 48 to count up for a first interval. The counter select circuit 54 then configures the multiplexer 50 to select the propagation delay frequency 30 as the clock signal 52 and configures the up/down counter 48 to count down for a second interval. The content of the up/down counter 48 after the up/down counting intervals represents the difference in frequency between the propagation delay frequency 30 and the reference frequency 34. At the end of the up/down counting interval, a latch 55 latches the digital output 56 of the up/down counter 48, and the output 57 of the latch 55 is converted by conversion circuitry 58 into an analog signal 60. The analog signal 60 is filtered 62, and the filtered signal 64 applied to the adjustable circuit 40 for adjusting the supply voltage and/or the clocking frequency 42.

In one embodiment, the propagation delay frequency 30 matches the reference frequency 34 when the supply voltage and/or clocking frequency 42 reaches a value corresponding to the target propagation delay for the critical path circuit 26. That is, the output 56 of the up/down counter 48 will be zero after the up/down counting intervals if the adjustable circuit 40 is set to the target value. If the propagation delay frequency 30 falls below the reference frequency 34, the up/down counter 48 will output 56 a positive value after the down counting interval thereby increasing the control signal 64 applied to the adjustable circuit 40. Conversion errors in the conversion circuitry 58 cause a voltage/clock error in 42, which is accounted for and substantially canceled by counter 48. If the propagation delay frequency 30 rises above the reference frequency 34, the up/down counter 48 will underflow after the down counting interval and output 56 a negative value which will decrease the control signal 64 applied to the adjustable circuit 40. Note that the precision of this circuit is proportional to the length of the counter, allowing the precision of the measurement to be traded off against the response speed and freeing the design from dependence on the conversion method 58 and filter 62.

In an alternative embodiment, the target propagation delay frequency 30 is substantially different than the reference frequency 34. This embodiment increases design flexibility, for example, if the critical path changes relative to the operating mode of the computing device or if two critical paths having significantly different propagation delays are operating simultaneously. The frequency comparator 36 is configured appropriately to account for the offset between the target propagation delay frequency 30 and the reference frequency 34. For example, in the embodiment of FIG. 4A, the up/down counter 48 may be initialized with an offset value (positive or negative) at each reset to account for the offset between frequencies. Alternatively, the up counting interval may be different than the down counting interval to account for the offset between frequencies.

In the embodiment of FIG. 4A, the conversion circuitry 58 comprises a digital-to-analog converter, and the up/down counter 48 is reset after each up/down counting cycle resulting in a proportional control loop. In an alternative embodiment shown in FIG. 4B, the output 56 of the up/down counter 48 is integrated using a digital accumulator 66 which accumulates the output 56 of the up/down counter 48 at the end of each up/down counting interval. The digital accumulator 66 outputs a digital value 68 that is converted into an analog signal 60 by conversion circuitry 58, thereby implementing an integral control loop. As described above with reference to FIG. 3A, integrating the propagation delay error overcomes the conversion tolerance of the conversion circuitry 58 since the propagation delay error is driven to zero independent of any conversion errors associated with converting the discrete-time signal 68 to a continuous-time signal 60 applied to the adjustable circuit 40. In an alternative embodiment, instead of using a digital accumulator 66 the integrating aspect is implemented by not resetting the up/down counter 48 at the end of each up/down counting cycle.

Figure 4C:
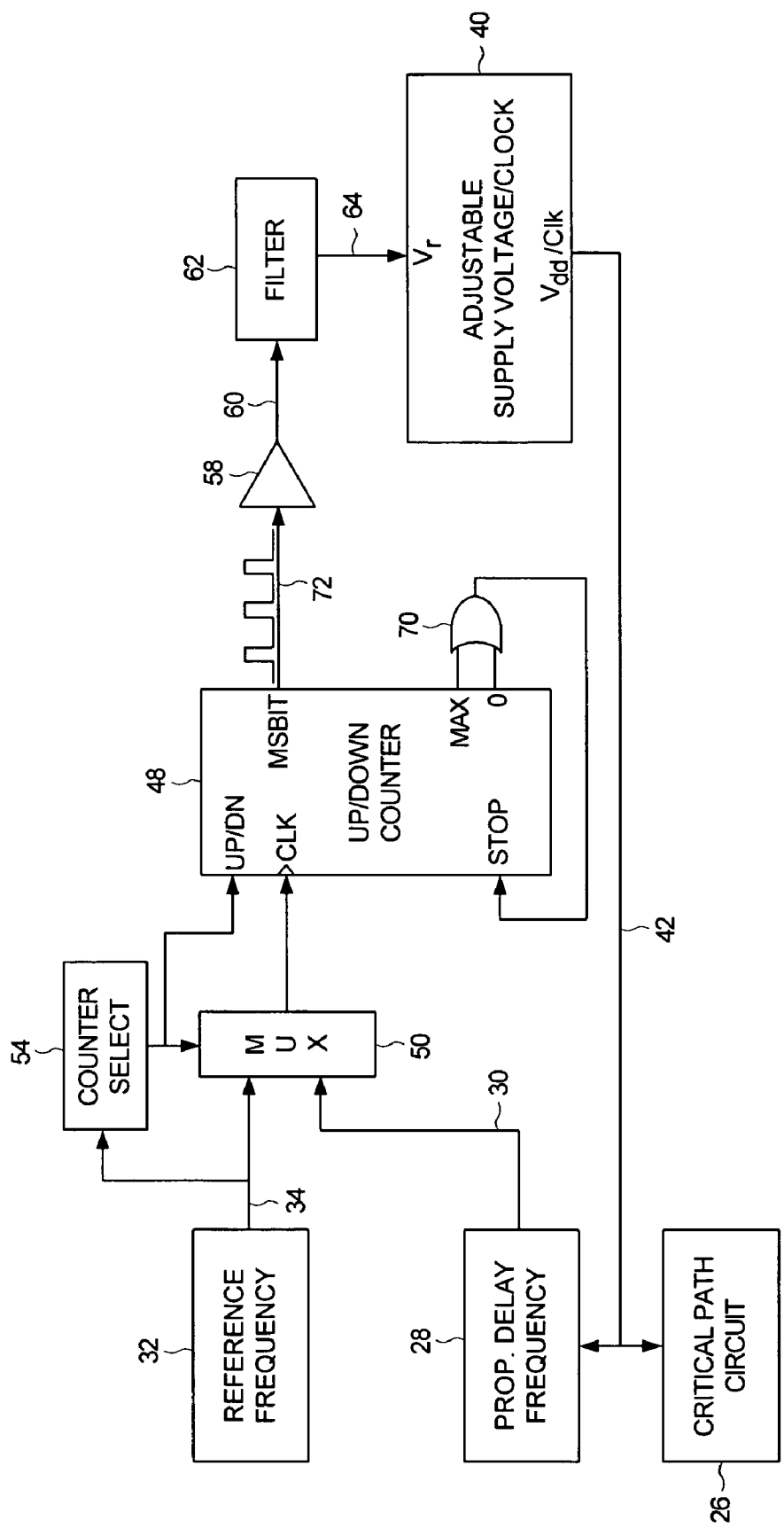
FIG. 4C shows an embodiment of the present invention wherein the up/down counter generates a PWM signal representing the difference between the reference frequency and the propagation delay frequency.

FIG. 4C shows an embodiment of the present invention wherein the up/down counter 48 is initialized with an offset value, and an OR gate 70 prevents the up/down counter from overflowing or underflowing. Also in this embodiment, the up/down counter 48 generates a PWM signal 72 from the most significant bit (MSBIT) of the counter value. In one embodiment, the up/down counter 48 is initialized with an offset value such that the duty cycle of the PWM signal 72 is 50% when the propagation delay error is zero. The duty cycle increases when the propagation delay error produces a lower propagation delay frequency 30 relative to the reference frequency 34, and the duty cycle decreases when the propagation delay error produces a higher propagation delay frequency 30 relative to the reference frequency 34. The digital PWM signal 72 is converted into a suitable analog signal 60 by a conversion circuit 58 such as a suitable buffer circuit.

Figure 4D:
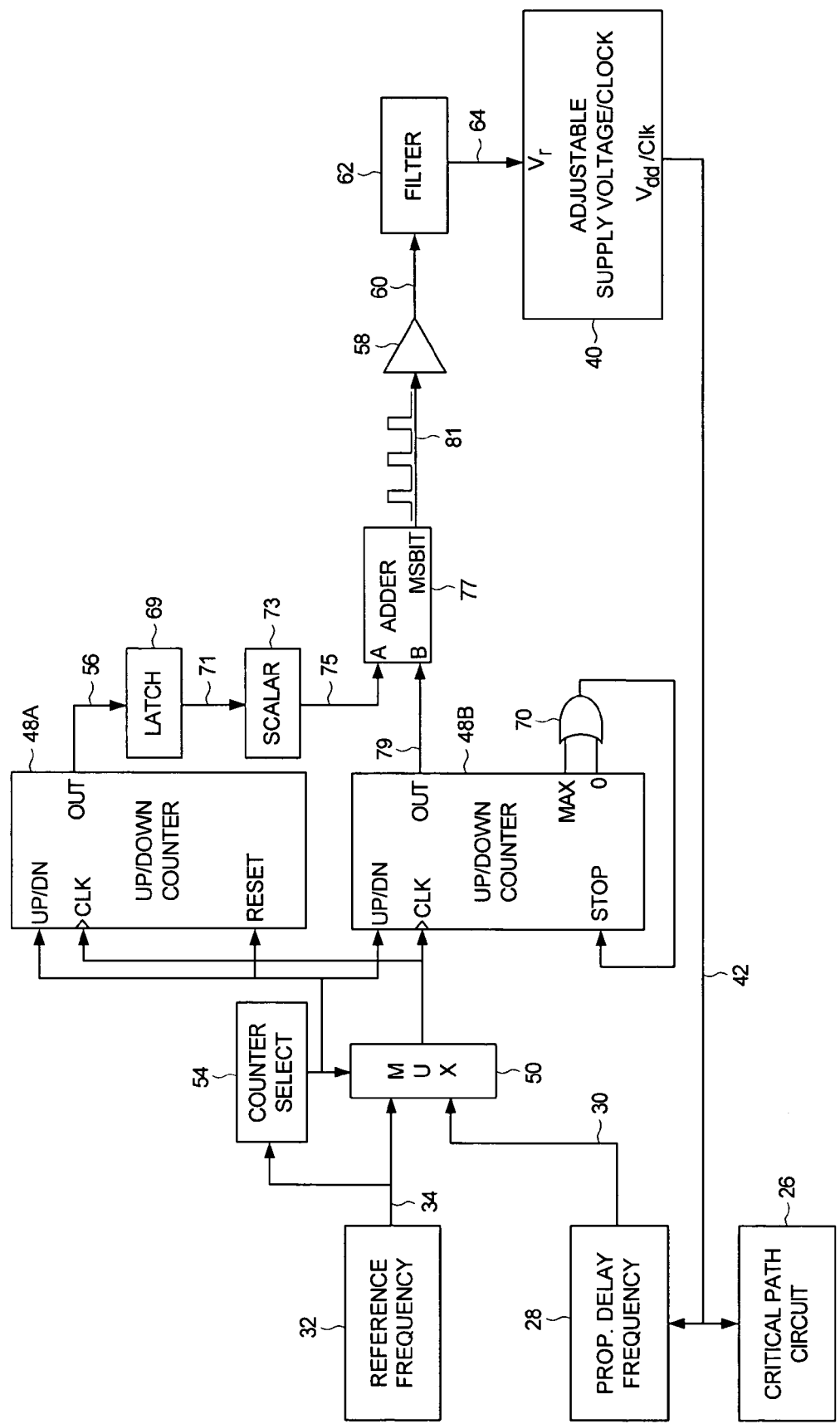
FIG. 4D shows an embodiment of the present invention wherein a first up/down counter and scalar generate a proportional frequency error signal which is added to an integrated frequency error signal generated by a second up/down counter to form a proportional/integral control loop.

FIG. 4D shows an embodiment of the present invention wherein a first and second up/down counters 48A and 48B implement a proportional/integral control loop. The first up/down counter 48A operates as described above with reference to FIG. 4A wherein the output 56 of the up/down counter 48A is latched 69 and the up/down counter 48A reset after the up/down counting interval. The output 71 of the latch 69 is scaled by scalar 73, and the resulting proportional frequency error signal 75 is applied to a first input of adder 77. The second up/down counter 48B operates similar to the up/down counter described above with reference to FIG. 4C except that the complete counter value is output 79 continuously (at each clock cycle) to the second input of the adder 77. The second up/down counter 48B is not reset at the end of the down counting interval such that the output 79 is an integrated frequency error signal. The most significant bit of the adder 77 is output as a PWM signal 81 representing the proportional/integral frequency error signal applied to the conversion circuit 58. The accuracy of the frequency error measurement is determined (or adjusted) by the length of the up/down counting intervals; however, increasing the up/down counting intervals increases the phase lag of the control loop. In one embodiment, the scalar 73 is adjusted to compensate for the increased phase lag and thereby achieve the desired frequency response.

Figure 4E:
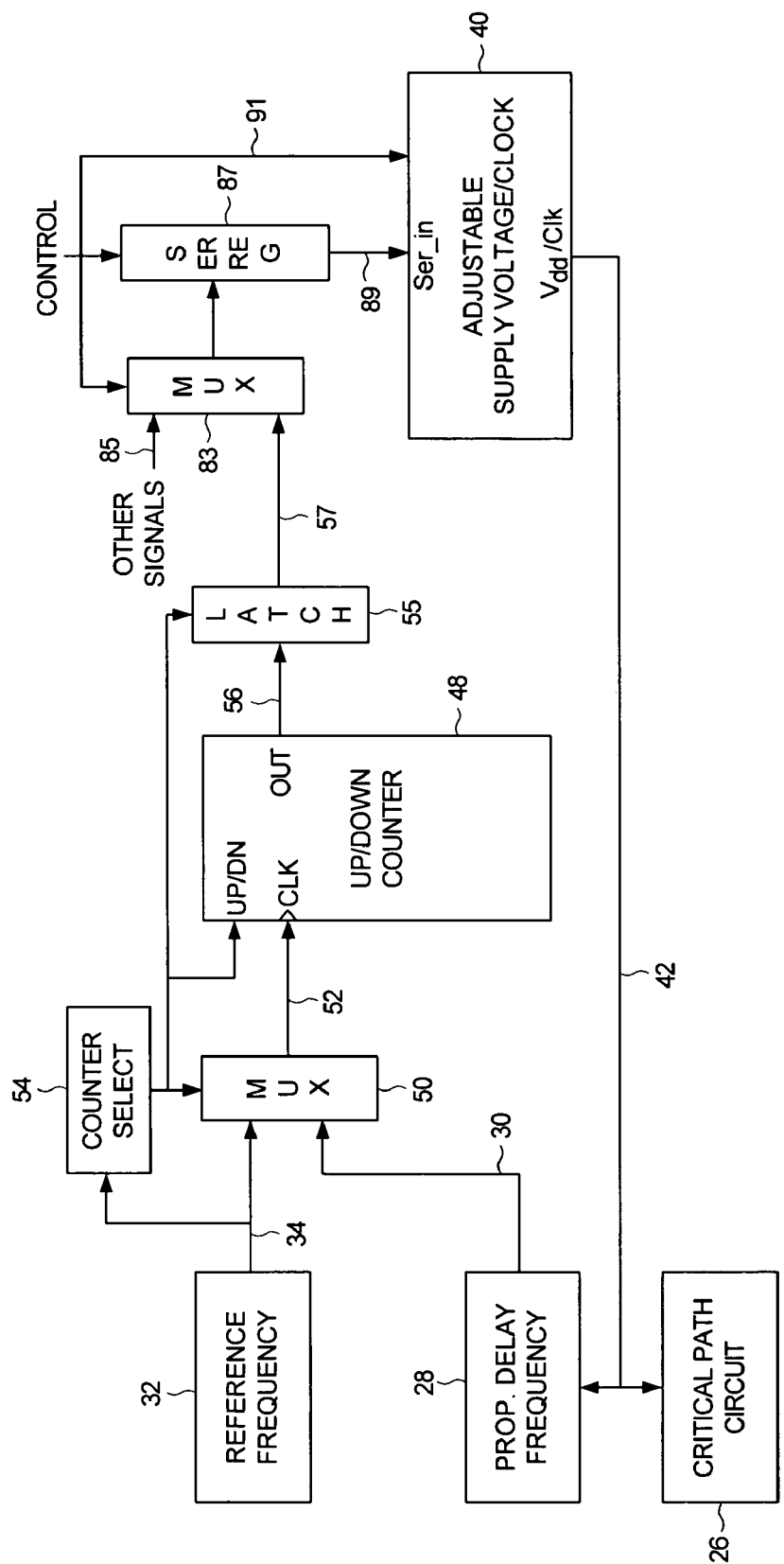
FIG. 4E shows an embodiment of the present invention wherein the output of the up/down counter is transmitted serially to the adjustable circuit for adjusting at least one of the supply voltage and the clocking frequency.

In yet another embodiment of the present invention, the frequency error signal 38 is transmitted serially as a digital signal to the adjustable circuit 40. For example, in one embodiment the adjustable circuit 40 is a conventional power driver integrated circuit that accepts other control signals over a serial input pin. An example of this embodiment is shown in FIG. 4E wherein a multiplexer 83 selects between the output 57 of the latch 55 and other control signals 85 as the input to a serial register 87. The contents of the serial register 87 are shifted out serially over line 89 and applied to a serial input pin of the adjustable circuit 40. A control signal 91 controls operation of the multiplexer 83, serial register 87, and adjustable circuit 40 in order to apply the appropriate control signals to the adjustable circuit 40 at the appropriate time. The frequency comparison technique of the present invention facilitates using a serial interface since the current frequency error signal can be transferred serially to the adjustable circuit 40 while computing the next frequency error signal (e.g., using the up/down counter 48). If the control loop comprises an integrator (e.g., by not resetting the up/down counter 48), the latch 55 may be omitted since any error in sampling the output 56 of the up/down counter 48 will be integrated out.

Figure 5:
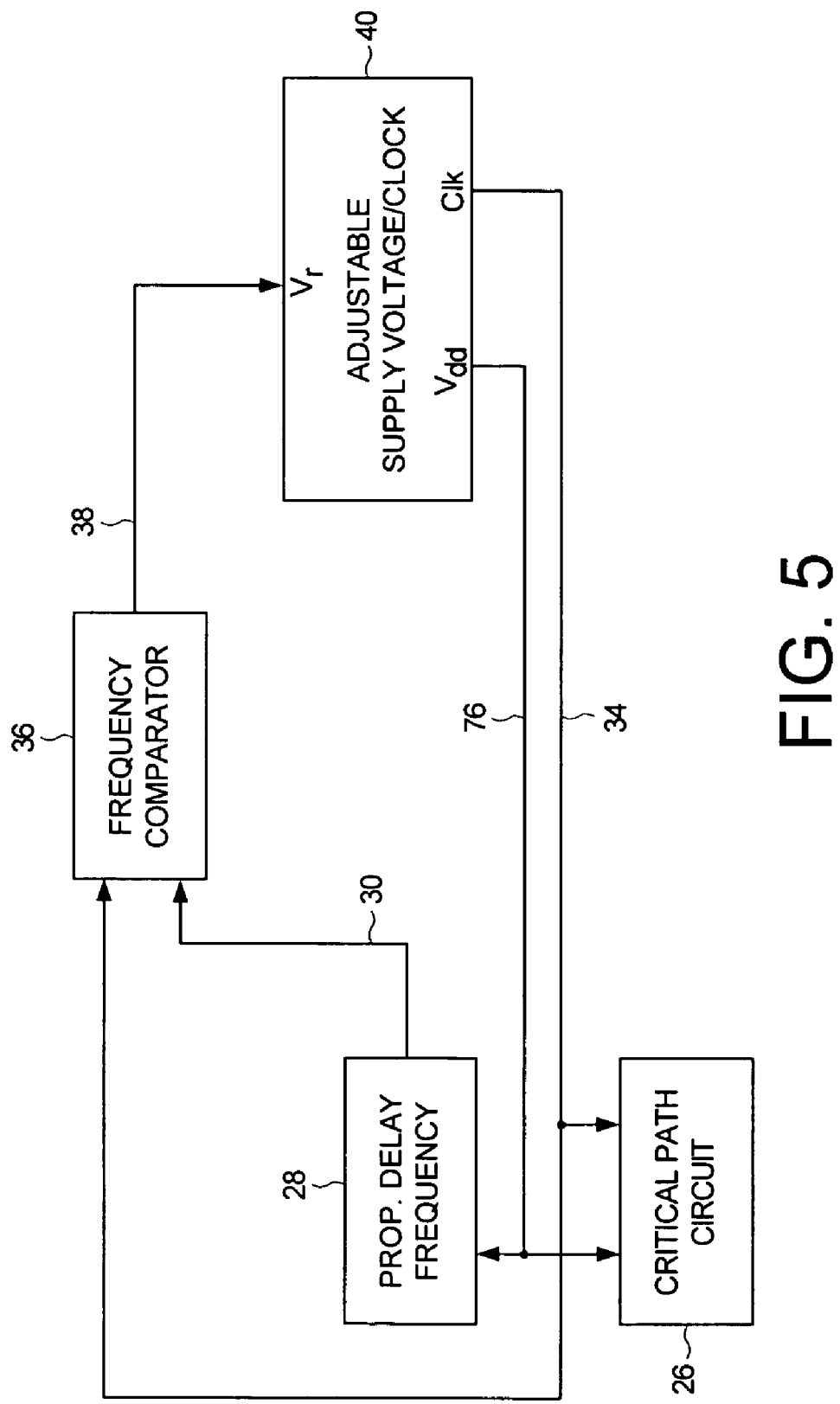
FIG. 5 shows an embodiment of the present invention wherein the reference frequency is generated in response to the clocking frequency.

In one embodiment, the reference frequency 34 is generated in response to the clocking frequency, and in an embodiment shown in FIG. 5, the reference frequency 34 is the clocking frequency for clocking the digital circuitry including the critical path circuit 26. This embodiment allows the clocking frequency to be adjusted, for example, to optimize power consumption or to change the operating frequency of the digital circuitry on-the-fly to facilitate different operating modes of the computing device. The target propagation delay of the critical path circuit 26 scales inversely with a change in the clocking frequency (reference frequency 34). For example, if the clocking frequency (reference frequency 34) is decreased to reduce power consumption, the target propagation delay increases and the target propagation delay frequency 30 decreases proportionally. This leads to the frequency error signal 38 causing the adjustable circuit 40 to decrease the supply voltage 76 applied to both the critical path circuit 26 and the propagation delay circuit 28 in order to decrease the propagation delay frequency 30. This results in a double power savings since both the clocking frequency and supply voltage are decreased. Conversely, if the computing device transitions into a high-frequency operating mode (e.g., a disk drive performing critical DSP operations during a demodulation mode), both the clocking frequency and the supply voltage are increased to meet the increased demand and the associated decrease in propagation delay of the critical path circuit 26.

Figure 6:
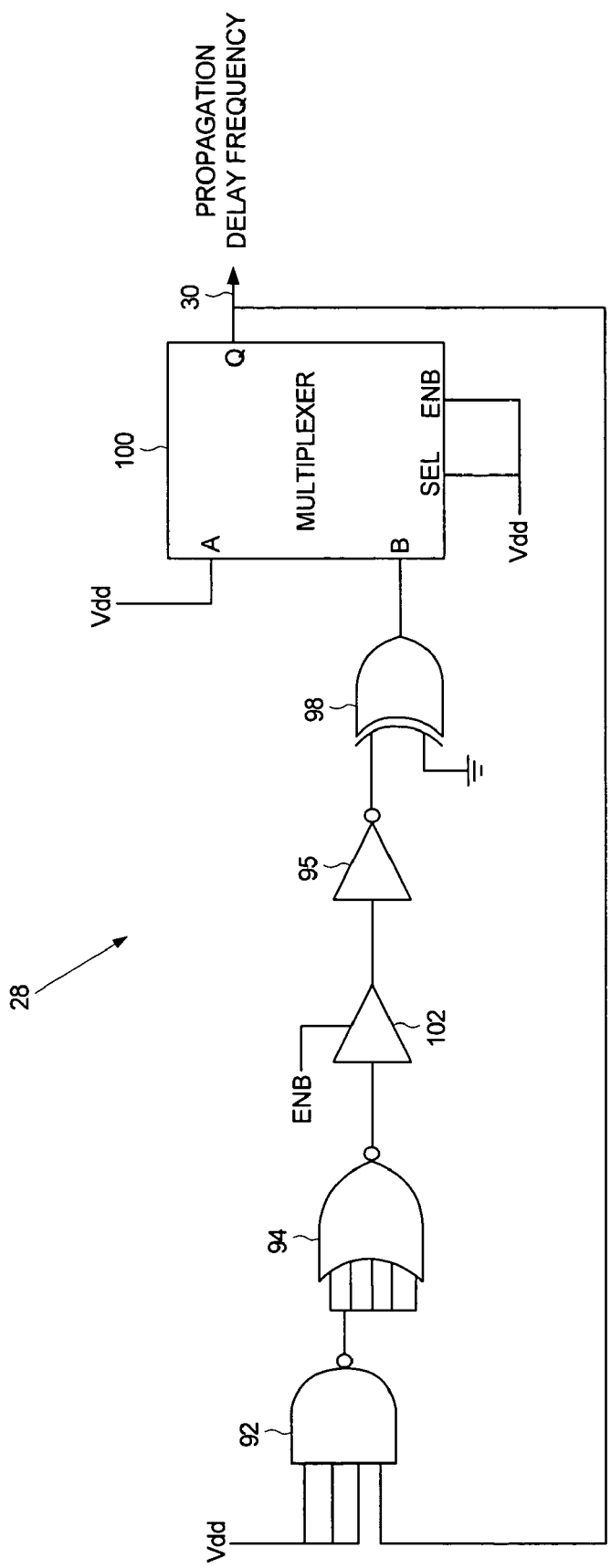
FIG. 6 shows an embodiment of the present invention wherein the propagation delay circuit comprises a matched delay oscillator comprising matched delay circuitry substantially matched to the critical path circuit.

The propagation delay circuit 28 of FIG. 2 may be implemented using any suitable circuitry that generates a frequency representing the propagation delay of the critical path circuit 26. In one embodiment shown in FIG. 6, the propagation delay circuit 28 is implemented as a matched delay oscillator for generating the propagation delay frequency 30. The matched delay oscillator comprises circuitry matching the critical path circuit 26 in both components and routing topology. In the example of FIG. 6, the critical path circuit 26 and corresponding matched delay oscillator comprise a NAND gate 92, a NOR gate 94, an inverter 96, an XOR gate 98, and a multiplexer 100. The output of the last component in the path (the multiplexer 100) wraps around to the input of the first component in the path (the NAND gate 92) such that the propagation delay through the path results in an corresponding oscillation that is output as the propagation delay frequency 30. The matched delay oscillator also comprises an enable buffer 102 for enabling/disabling the circuit, for example, relative to a mode of operation of the computing device.

In an alternative embodiment, the propagation delay circuit 28 does not exactly match the critical path circuit 26 but rather comprises circuitry and topology that emulates the critical path circuit 26. In yet another embodiment, the critical path circuit 26 itself is configured into the propagation delay circuit 28 during a calibration mode. Once the optimal supply voltage and/or clocking frequency are determined during the calibration mode, the critical path circuit 26 is reconfigured for normal operation.

Figure 7:
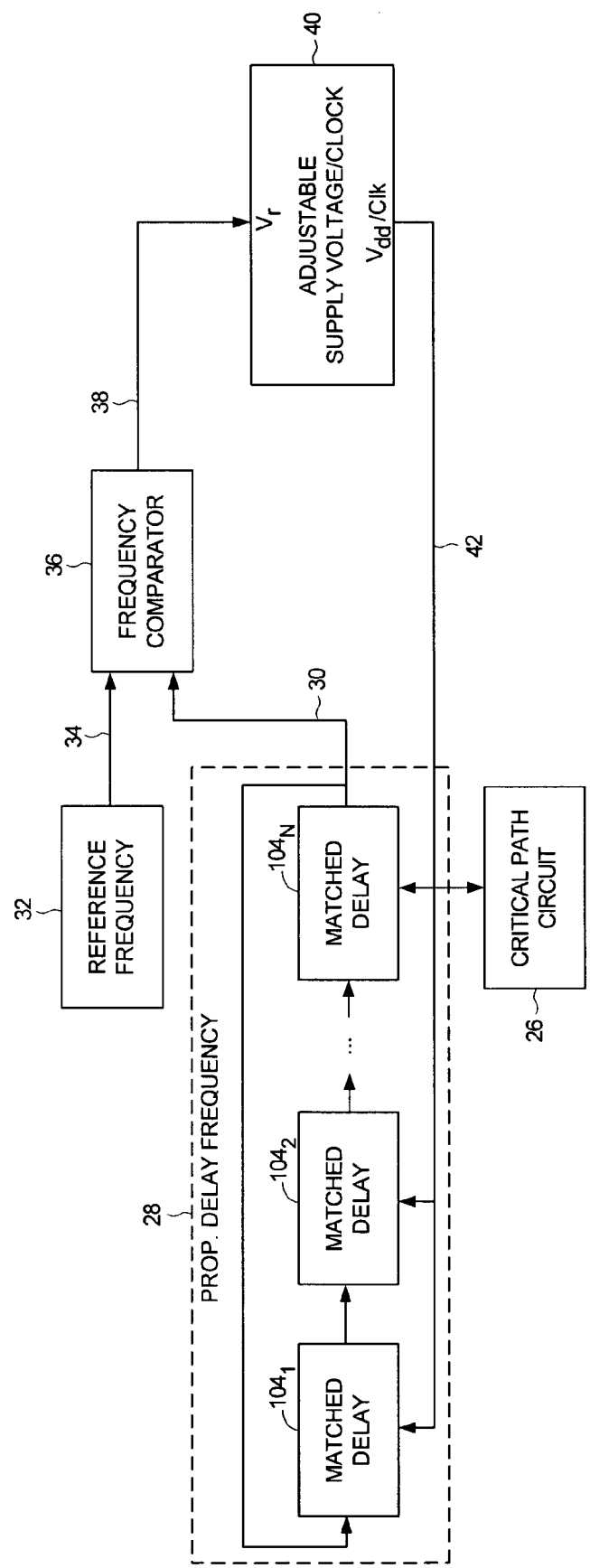
FIG. 7 shows an embodiment of the present invention wherein the propagation delay circuit comprises a plurality of matched delay circuits connected in series in order to scale the propagation delay frequency.

FIG. 7 shows yet another embodiment of the present invention wherein the propagation delay circuit 28 comprises a plurality of matched delay circuits $104_1$–$104_N$ connected in series in order to scale the propagation delay frequency 30, wherein each matched delay circuit $104_i$ substantially matches the critical path circuit 26. The propagation delay frequency 34 decreases as more matched delay circuits 104 are added which may simplify certain implementation details, such as decreasing the reference frequency 34 or simplifying the frequency comparator 36.

We claim:

1. A computing device comprising:
   (a) digital circuitry including a critical path circuit;
   (b) a propagation delay circuit for generating a propagation delay frequency representing a propagation delay of the critical path circuit;
   (c) a reference frequency;
   (d) a frequency comparator for generating a frequency error signal representing a difference between the reference frequency and the propagation delay frequency; and
   (e) an adjustable circuit, responsive to the frequency error signal, for adjusting at least one of a supply voltage a power source and a clocking frequency applied to the critical path circuit.

2. The computing device as recited in claim 1, wherein the propagation delay circuit comprises a matched delay oscillator.

3. The computing device as recited in claim 2, wherein the matched delay oscillator comprises a plurality of matched delay circuits connected in series in order to scale the propagation delay frequency, wherein each matched delay circuit substantially matches the critical path circuit.

4. The computing device as recited in claim 1, further comprising an integrator for generating an integrated frequency error signal, wherein the adjustable circuit is responsive to the integrated frequency error signal.

5. The computing device as recited in claim 4, further comprising:
   (a) a scalar for generating a proportional frequency error signal; and
   (b) an adder for adding the integrated frequency error signal to the proportional frequency error signal to generate a proportional/integral frequency error signal, wherein the adjustable circuit is responsive to the proportional/integral frequency error signal.

6. The computing device as recited in claim 4, wherein the integrator comprises discrete-time circuitry.

7. The computing device as recited in claim 4, wherein the integrated frequency error signal is a discrete-time signal.

8. The computing device as recited in claim 7, further comprising conversion circuitry for converting the integrated frequency error signal into a continuous-time signal, wherein the adjustable circuit is responsive to the continuous-time signal.

9. The computing device as recited in claim 1, wherein:
   (a) the frequency comparator comprises an up/down counter;
   (b) the up/down counter is clocked by the reference frequency for a first interval; and
   (c) the up/down counter is clocked by the propagation delay frequency for a second interval.

10. The computing device as recited in claim 9, wherein at least one of the first and second intervals is programmable.

11. The computing device as recited in claim 9, wherein the up/down counter outputs a pulse width modulated (PWM) signal having a duty cycle proportional to the difference between the reference frequency and the propagation delay frequency.

12. The computing device as recited in claim 11, further comprising a filter for filtering the PWM signal.

13. The computing device as recited in claim 1, wherein the frequency error signal is a digital signal applied serially to a serial input of the adjustable circuit.

14. The computing device as recited in claim 1, wherein the reference frequency is generated in response to the clocking frequency applied to the critical path circuit.

15. A method of adjusting at least one of a supply voltage a power source and a clocking frequency applied to digital circuitry of a computing device, the digital circuitry comprising a critical path circuit, the method comprising the steps of:
   (a) generating a propagation delay frequency representing a propagation delay of the critical path circuit;
   (b) generating a reference frequency;
   (c) generating a frequency error signal representing a difference between the reference frequency and the propagation delay frequency; and
   (d) adjusting at least one of the supply voltage and the clocking frequency in response to the frequency error signal.

16. The method as recited in claim 15, wherein the propagation delay frequency is generated using a matched delay oscillator.

17. The method as recited in claim 16, further comprising the step of generating an integrated frequency error signal, wherein the step of adjusting at least one of the supply voltage and the clocking frequency is responsive to the integrated frequency error signal.

18. The method as recited in claim 17, further comprising the steps of
   (a) generating a proportional frequency error signal; and
   (b) adding the integrated frequency error signal to the proportional frequency error signal to generate a proportional/integral frequency error signal, wherein the step of adjusting at least one of the supply voltage and the clocking frequency is responsive to the proportional/integral frequency error signal.

19. The method as recited in claim 17, wherein the integrated frequency error signal is generated in discrete time.

20. The method as recited in claim 17, wherein the integrated frequency error signal is a discrete-time signal.

21. The method as recited in claim 20, further comprising the step of converting the integrated frequency error signal into an continuous-time signal, wherein the step of adjusting at least one of the supply voltage and the clocking frequency is responsive to the continuous-time signal.

22. The method as recited in claim 15, the step of generating the frequency error signal comprises the steps of:
   (a) clocking an up/down counter with the reference frequency for a first interval; and
   (b) clocking the up/down counter with the propagation delay frequency for a second interval.

23. The method as recited in claim 22, further comprising the step of programming at least one of the first and second intervals.

24. The method as recited in claim 22, wherein the up/down counter outputs a pulse width modulated (PWM) signal having a duty cycle proportional to the difference between the reference frequency and the propagation delay frequency.

25. The method as recited in claim 24, further comprising the step of filtering the PWM signal.

26. The method as recited in claim 15, further comprising the step of transmitting the frequency error signal serially to an adjustable circuit for adjusting at least one of the supply voltage and clocking frequency.

27. The method as recited in claim 15, further comprising the step of generating the reference frequency in response to the clocking frequency applied to the digital circuitry.

* * * * *